(12) United States Patent
Powers

(10) Patent No.: US 10,103,084 B2
(45) Date of Patent: Oct. 16, 2018

(54) SYSTEM AND METHOD FOR CLAMPING PRESS PACK HIGH POWER SEMICONDUCTOR

(71) Applicant: LWE, Inc., Maple Grove, MN (US)

(72) Inventor: Al Powers, Maple Grove, MN (US)

(73) Assignee: LWE, INC., Maple Gove, MN (US)

( * ) Notice: Subject to any disclaimer, the term of this patent is extended or adjusted under 35 U.S.C. 154(b) by 0 days.

(21) Appl. No.: 15/297,616

(22) Filed: Oct. 19, 2016

(65) Prior Publication Data

US 2017/0112012 A1 Apr. 20, 2017

Related U.S. Application Data

(60) Provisional application No. 62/243,958, filed on Oct. 20, 2015.

(51) Int. Cl.
*G01M 5/00* (2006.01)
*G01M 99/00* (2011.01)
*H01L 23/40* (2006.01)

(52) U.S. Cl.
CPC ............. *H01L 23/40* (2013.01); *G01M 5/005* (2013.01); *G01M 99/00* (2013.01)

(58) Field of Classification Search
CPC ........ H05K 7/12; H05K 7/209; G01G 3/1402; G01G 7/02; G01G 1/044; G01G 5/003; G01G 9/005; G01N 3/20; G01N 3/22; G01N 3/62; G01N 2203/0021; G01N 2203/0222; G01N 2203/0282; G01N 3/04; G01N 3/24; G01N 2203/021; G01N 2203/0278; G01L 1/2231; G01L 25/00
See application file for complete search history.

(56) References Cited

U.S. PATENT DOCUMENTS

| | | | |
|---|---|---|---|
| 3,651,383 A * | 3/1972 | Livezey | H01L 23/051 257/688 |
| 2012/0169869 A1* | 7/2012 | You | A63B 53/10 348/142 |
| 2015/0327395 A1* | 11/2015 | Spencer | H05K 7/2039 361/704 |

OTHER PUBLICATIONS

"Semiconductor Data Handbook", General Electric Company, third edition, Syracuse, NY, USA, 2007, 8 pages.

* cited by examiner

Primary Examiner — Harshad R Patel
Assistant Examiner — Brandi Hopkins
(74) Attorney, Agent, or Firm — Hamre, Schumann, Mueller & Larson, P.C.

(57) ABSTRACT

Systems and methods for setting, assembling, and/or monitoring deflection (and thus load) in a load beam of a clamping system for a press pack high power semiconductor. The clamping system includes an assembly of a heat sink, a clamp component, and a semiconductor package. The clamp component includes two or more bolts securely connecting a load beam to the heat sink, with the semiconductor package sandwiched between the load beam and the heat sink. A detector and a calibration gage can be assembled onto the clamping system to detect and/or measure the depth of curvature of the load beam.

8 Claims, 14 Drawing Sheets

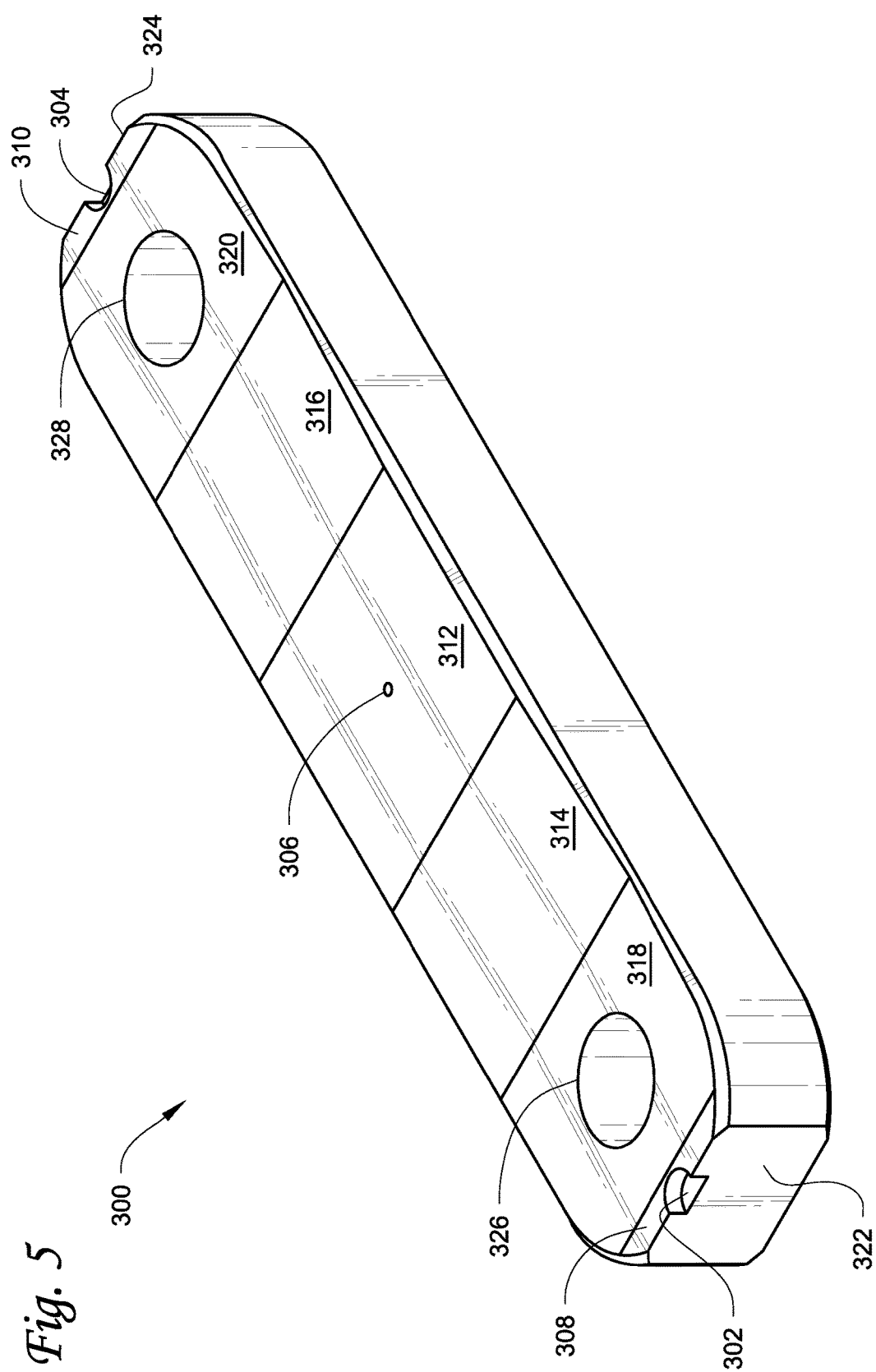

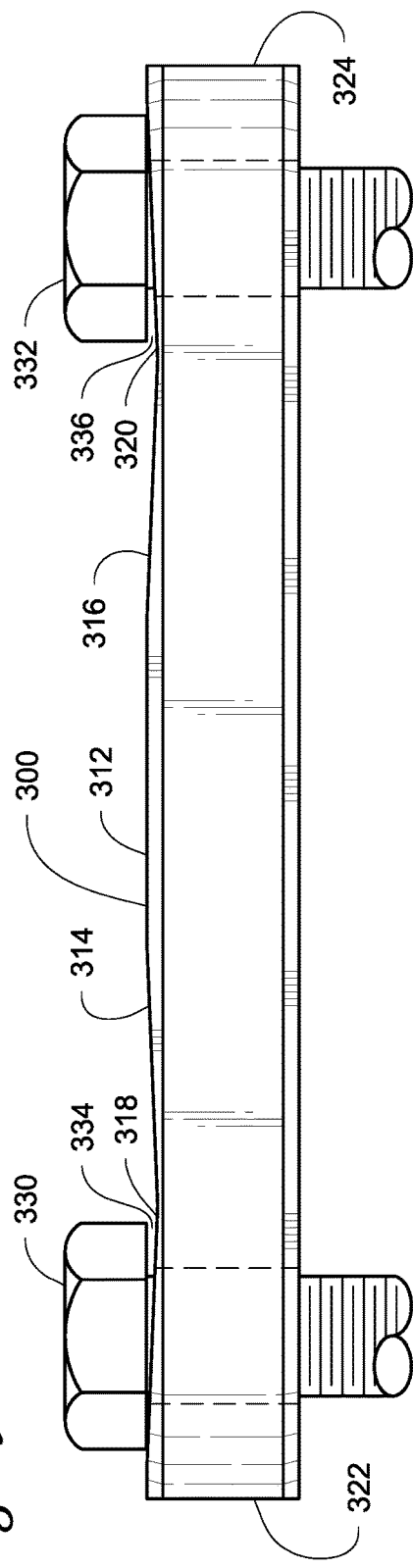
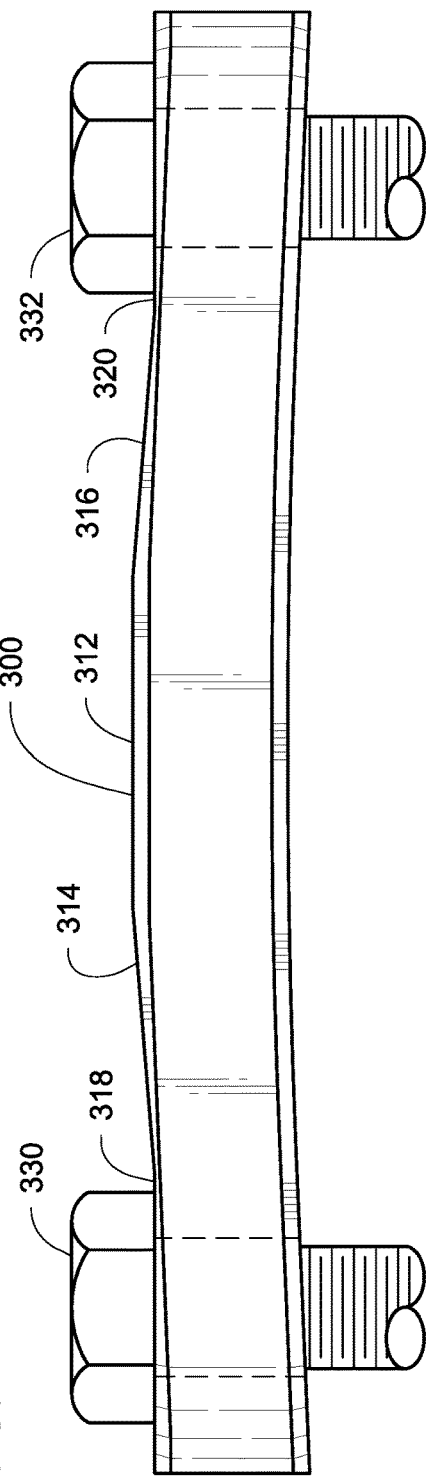
Fig. 6A
Fig. 6B

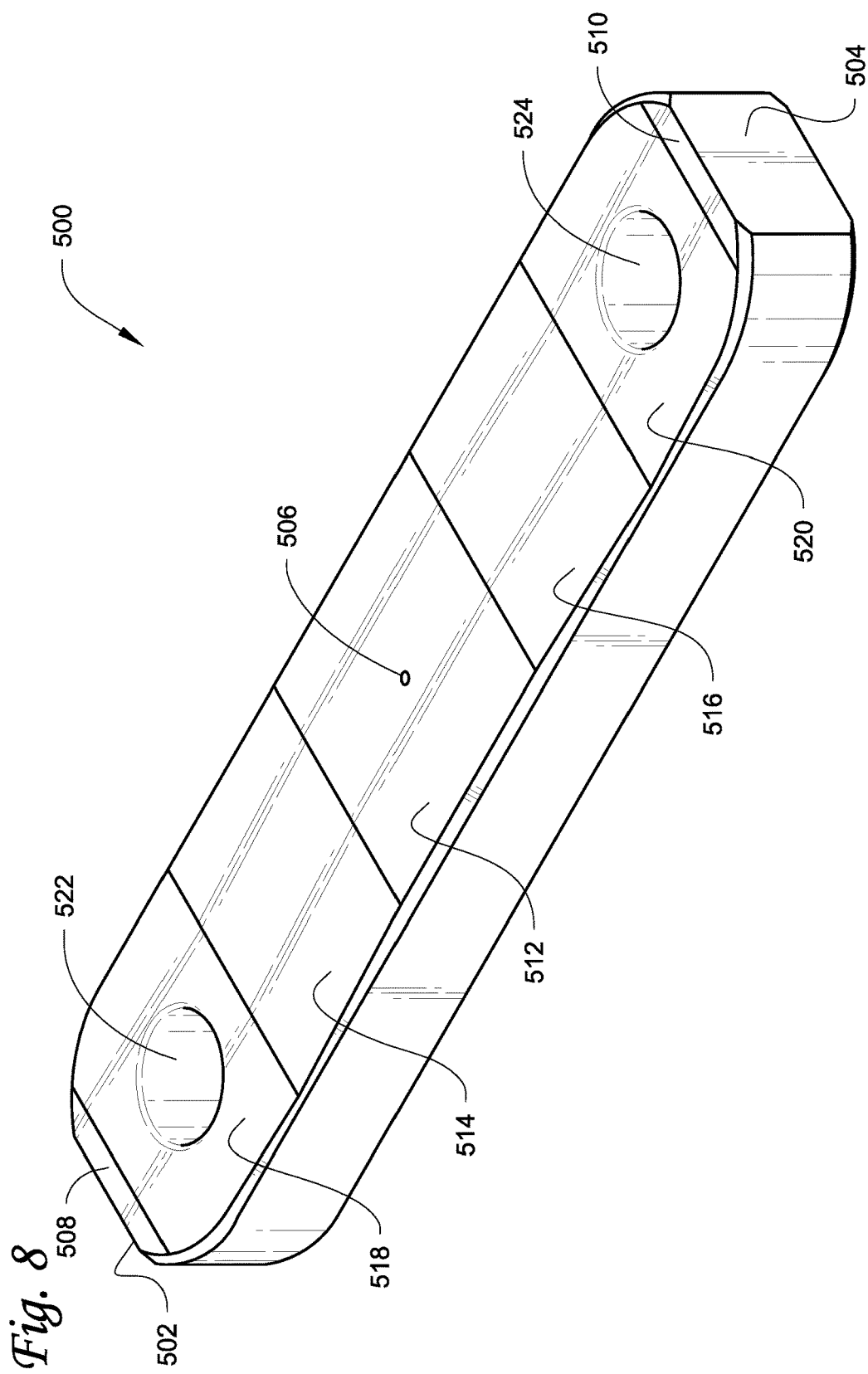

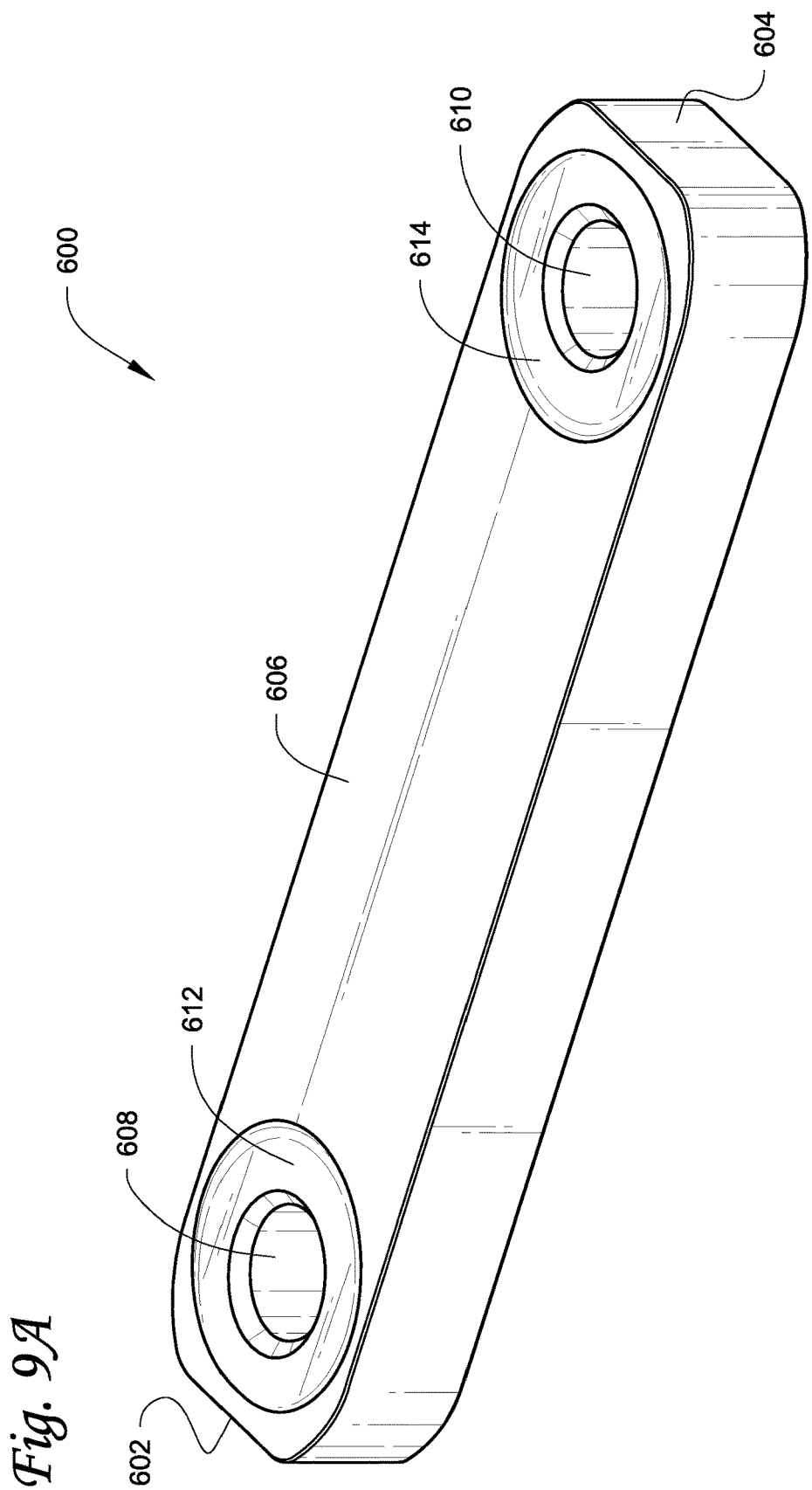

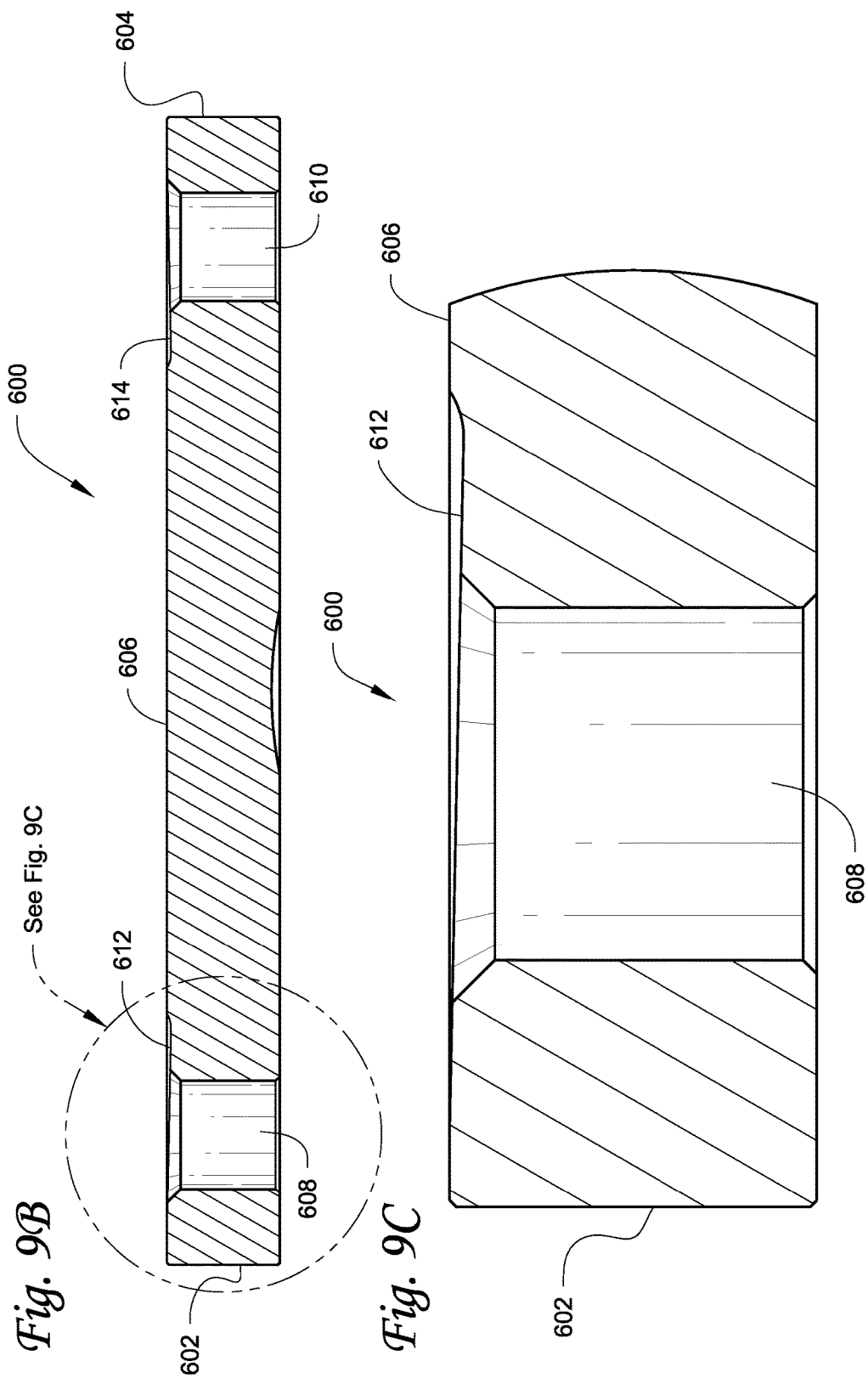

SYSTEM AND METHOD FOR CLAMPING PRESS PACK HIGH POWER SEMICONDUCTOR

FIELD

This description relates generally to clamping systems and methods for clamping press pack high power semiconductor(s).

BACKGROUND

A press pack high power semiconductor(s) is used as a high power device that has a very high current rating (i.e., greater than 100 amperes). The press pack high power device has a structure configured to protect the semiconductor element from current concentration and for controlling thermal stress (e.g., heat transfer out of the semiconductor element). A mechanical clamp is used for configuring one or more press pack high power semiconductor(s) to a heat sink, a bus bar, and/or other components. The mechanical clamps are designed to ensure that the press pack high power semiconductor(s) is clamped with appropriate force allowing a homogeneous pressure distribution over a majority portion of a contact surface. The mechanical clamp can use a leaf spring or other load bearing structure to distribute the clamping forces evenly. This kind of load bearing structure can wear out or degrade over time due to many factors, and as the load bearing structure can eventually fail (e.g., fail to provide even distribution of forces, fail to provide clamping forces, break, bend, etc.). Generally, the only time an operator becomes aware that the load bearing structure has worn out (e.g., is degraded) is when it fails, e.g., due to breakage or failure of the semiconductor element due to a thermal runaway.

BRIEF SUMMARY

The present invention is directed to systems and methods for detecting, setting, assembling, and/or monitoring deflection (and thus load) in a load beam of a clamping system for a press pack high power semiconductor. The clamping system includes an assembly of a heat removal device (for example, a heat sink), a clamp component, and a semiconductor package. In an embodiment, an exemplary clamp component can include at least two bolts (each having a bolt head and a threaded portion) for connecting a load beam to the heat sink, with the semiconductor package sandwiched between the load beam and the heat sink. The assembly can be connected to a second assembly having another heat removal device, another clamp component, and another semiconductor package.

An exemplary clamping system includes a pivot block disposed beneath and in contact with the load beam, and an insulator surrounding rod portions of the bolts. The insulator can be configured to surround and contain the pivot block, and at least some of the load beam. A detector and a calibration gage can be assembled onto the clamping system to detect the depth of curvature of the load beam due to the bending of the load beam. The devices, systems, and methods can be used in a vehicle, such as a locomotive (i.e., a train).

An embodiment of a method for detecting a depth of curvature of a top surface of a load beam of a clamped press pack high power semiconductor includes placing a detector on a calibration gage so that a sensor tip of the detector penetrates through the calibration gage; and placing the calibration gage on the clamped press pack high power semiconductor, wherein the sensor tip contacts the top surface of the load beam, the calibration gage is configured to define a virtual plane, and a distance of the sensor tip from the virtual plane is detected by the detector. The method can further include removing the detector and the calibration gage from the clamped press pack high power semiconductor. In addition, the method can also include the step of removing the detector from the calibration gage. Further, the method can further include, after the steps of removing the detector and the calibration gage, again placing the detector on the calibration gage so that the sensor tip of the detector penetrates through the calibration gage; and again placing the calibration gage on the clamped press pack high power semiconductor, wherein the sensor tip contacts the top surface of the load beam, a second distance of the sensor tip from the virtual plane is detected by the detector. The method can further include comparing the distance to the second distance to determine an amount of deflection that has occurred to the load beam (the change in the depth of curvature of the load beam).

An embodiment of a method for detecting a depth of curvature of a top surface of a load beam of a clamped press pack high power semiconductor includes placing a calibration gage on the clamped press pack high power semiconductor; and placing a detector on the calibration gage so that a sensor tip of the detector penetrates through the calibration gage and contacts the top surface of the load beam, wherein the calibration gage is configured to define a virtual plane, wherein a distance of the sensor tip from the virtual plane is detected, and the depth of curvature of the load beam is detected by the detector. The method can further include the detector determining the depth of curvature. The method can include one or more of the following steps: removing the detector from the calibration gage; and/or removing the calibration gage from the clamped press pack high power semiconductor. The method can further include, after the steps of removing the detector and the calibration gage, one or more of the following steps: again placing the calibration gage on the clamped press pack high power semiconductor, and again placing the detector on the calibration gage so that the sensor tip of the detector penetrates through the calibration gage and contacts the top surface of the load beam, wherein a second distance of the sensor tip from the virtual plane is detected, and the depth of curvature of the load beam is detected by the detector. The method can further include comparing the distance to the second distance to determine an amount of deflection that has occurred to the load beam (the change in the depth of curvature of the load beam).

BRIEF DESCRIPTION OF THE DRAWINGS

FIG. 5 shows an exemplary load beam for the clamping system shown in FIGS. 1 and 2.

FIGS. 6A-6B show side schematic views of the load beam shown in FIG. 5.

FIG. 8 shows another exemplary load beam for the clamping system shown in FIGS. 1 and 2.

FIGS. 9A-9C show another exemplary load beam for the clamping system shown in FIGS. 1 and 2.

DETAILED DESCRIPTION

Figure 1:
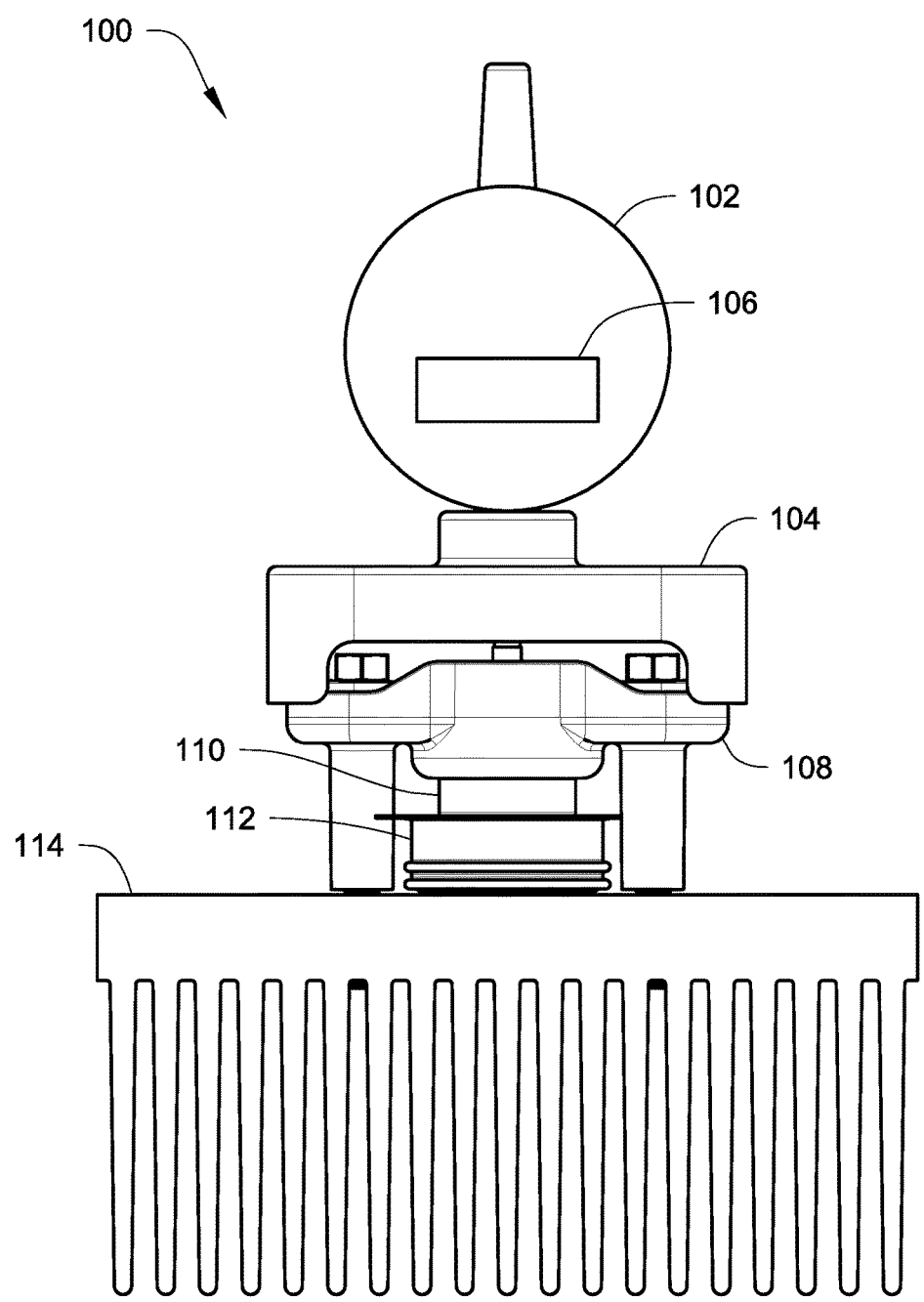
FIG. 1 shows a front elevation view of an embodiment for a clamping system.

The present disclosure may be further understood with reference to the following description and the appended drawings, wherein like elements are referred to with the same reference numerals. Systems, devices, and methods disclosed herein are directed towards clamping press pack devices, such as press pack high power semiconductors. The embodiments of the clamped press pack devices and methods disclosed herein can be used in locomotives and/or other applications.

FIG. 1 shows an exemplary clamping system 100, which includes a detector 102 for detecting and/or determining a depth of curvature of a load beam. The detector 102 has a component (e.g., a sensor tip) that is placed through a body of a calibration gage 104 to contact the load beam. The detector 102 includes a display 106 that displays a detected displacement of the component (e.g., the sensor tip) from some standard (i.e., a "zero" value that is predetermined, or a later determined relative value).

The calibration gage 104 contacts the load beam and the insulator 108. The insulator 108 is configured to be positioned above the electrical bus bar 110. In some embodiments, the calibration gage 104 can be secured to the insulator 108 which can ensure that the detector 102 can make contact with the same contact portion of the load beam at least once, more than once, and/or repeatedly throughout an operational life of the load beam. In some embodiments, the calibration gage does not make any contact with the insulator.

FIG. 1 does not show the load beam because the insulator 108 covers a substantial (or most, or every) portion of a thickness of the load beam. FIG. 1 also does not show a pivot block, which is arranged between the load beam and the lower inside surface of the insulator 108, because the pivot block is entirely contained in an inside space defined by the insulator 108 and the load beam. Some embodiments of the insulator 108 includes contact portions that contact the calibration gage 104 to secure the calibration gage 104 in place (e.g., immobile with respect to the load beam). Some embodiments of the insulator does not include contact portions that contact the calibration gage at all because in these embodiments, the calibration gage does not make any contact with the insulator.

The material of the insulator 108 can be critical to the functioning of the clamp 100. For example, inadequate levels of physical creep resistance in the clamp material will lead directly to clamp preload loss. Further, inadequate compressive yield strength will lead directly to unacceptable and permanent deformations of the insulator during preloading. Accordingly, the electrical insulating requirements for the application must be met by the insulator 108. Even further, surface arcing resistance over time must be met by the insulator 108. Thus, the insulator 108 must have properties that are physically robust against the environment the clamp operates in, such as wrenches used to tighten the bolts, impact damage from tools, etc. Further, it is preferable that the insulator 108 has properties that are robust against long term exposure to a variety of unknown chemical environments. Many of the physical properties of the insulator 108 are strongly influenced by the temperature the insulator 108 is exposed to during use. For example, the insulator's 108 yield strength drops with increasing temperature, and physical creep resistance drops with increasing temperature. In some operational conditions, there is a need for the clamping system 100 to function for years (even decades) without adjustment to the clamping forces (applied during the assembly of the clamping system 100). As such, it is advantageous for the clamping system 100 to be designed and configured to survive and function with nearly perfect resistance to the environment the clamping system 100 exists. Thus, to achieve this advantage, the selection of the material for the insulator 108 must meet a set of performance requirements to achieve these advantages. Further, the cost of in service failure (e.g., failure of the clamping system 100 during operation and/or use) and reliability requirements might eclipse other considerations in selection the material for the insulator 108.

Further, the shape of the insulator 108 must not only accommodate the many design requirements of the insulator 108 but also allow a part to be manufactured at as reasonable a cost as is possible with the material selected to make up the insulator 108. The temperature the insulator 108 is exposed to during operation and/or use and the associated degradation in physical properties can restrict the selection of material severely. Additionally the need for a highly accurate molded part in some of the insulator's 108 features can restrict the selection of material as well.

Collectively, the above described requirements for the insulator 108 narrow the possible materials to highly glass filled polyetheretherketone (PEEK), liquid crystal polymer (LCP), thermoplastic polyester, and polyimide. Thus, the insulator 108 is made from an insulating material, wherein the insulating material can be or includes polymers, PEEK, LCP, thermoplastic polyester, polyimide, and a combination thereof.

The clamping system 100 also includes an electrical bus bar 110, a press pack semiconductor 112, and a heat sink 114. The electrical bus bar 110 is arranged below a bottom surface portion of the insulator 108, and the press pack semiconductor 112 is arranged below the electrical bus bar 110. The heat sink 114 is arranged below the press pack semiconductor 112, so that the electrical bus bar 110 and the heat sink 114 sandwich the press pack semiconductor 112.

Figure 2:
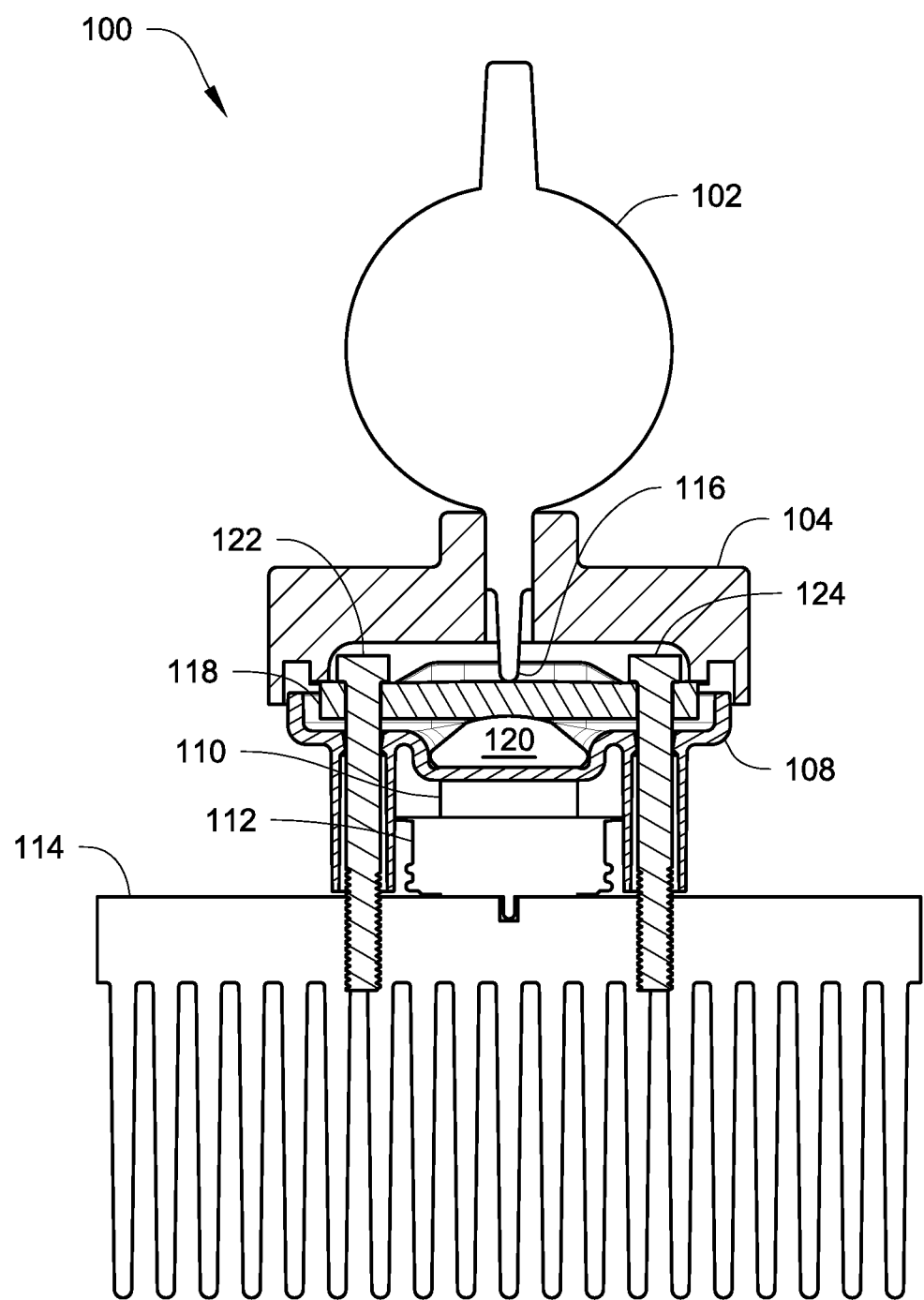
FIG. 2 shows a cutaway and internal view from the front of the embodiment for the clamping system shown in FIG. 1.

FIG. 2 shows a cutaway and internal view from the front of the clamping system 100 shown in FIG. 1. FIG. 2 shows the sensor tip 116 of the detector 102 placed through a hole in the body of the calibration gage 104 to contact the load beam 118. On the opposite side of the sensor tip 116, the load beam 118 is contacted by a pivot block 120. The load beam 118 and the pivot block 120 are arranged together so that when the load beam 118 bends due to heat and/or wear. The position of the pivot block 120 being below the load beam 118, and being in contact with the load beam 118 ensures that the bending of the load beam 118 moves the top surface of the load beam 118 to move "upwards" (i.e., rises) which would move the sensor tip 116 upwards as well if it were in contact with the top surface of the load beam 118. While the heat and/or wear causes the load beam 118 to be bent towards the pivot block 120, a portion of the load beam 118 supported by the pivot block 120 remains stationary and the outer portions of the load beam 118 is drawn downward by the bolts. Because the clamping system 100 provides support at the ends of the downwardly deflected load beam 118, clamping system 100 moves down relative to the center of the load beam 118 causing an upward motion of the sensor tip 116 of the detector 102 relative to the clamping system 100.

The calibration gage 104 is arranged to contact the load beam 118 to set and/or define a virtual plane (i.e., the "standard" described above) from which the sensor tip 116 can be displaced away along the normal direction (i.e., rising direction) with respect to the virtual plane. Thus, the detector 102 detects the height displacement of the sensor tip 116 with respect to the virtual plane (i.e., the stand).

Some embodiments of the calibration gage 104 has portions that engage the insulator 108. Some embodiments of the calibration gage 104 requires that the calibration gage 104 does not make any contact with the insulator 108. The engagement of the calibration gage 104 with the load beam 118 can ensure that the calibration gage 104 can be configured for accurate and precise detection of the height displacement of the sensor tip 116.

The clamping system 100 also includes two bolts 122, 124 that penetrate through the load beam 118 and connect to the heat sink 114. For example, each of the bolts 122, 124 have head portions that engage the load beam 118 and threaded portions that screw into matching threaded holes in the heat sink 114. Thus, the bolts 122, 124 can clamp the press pack semiconductor 110 to the heat sink 114 with a clamping force sufficient to maintain this configuration.

Figure 3:
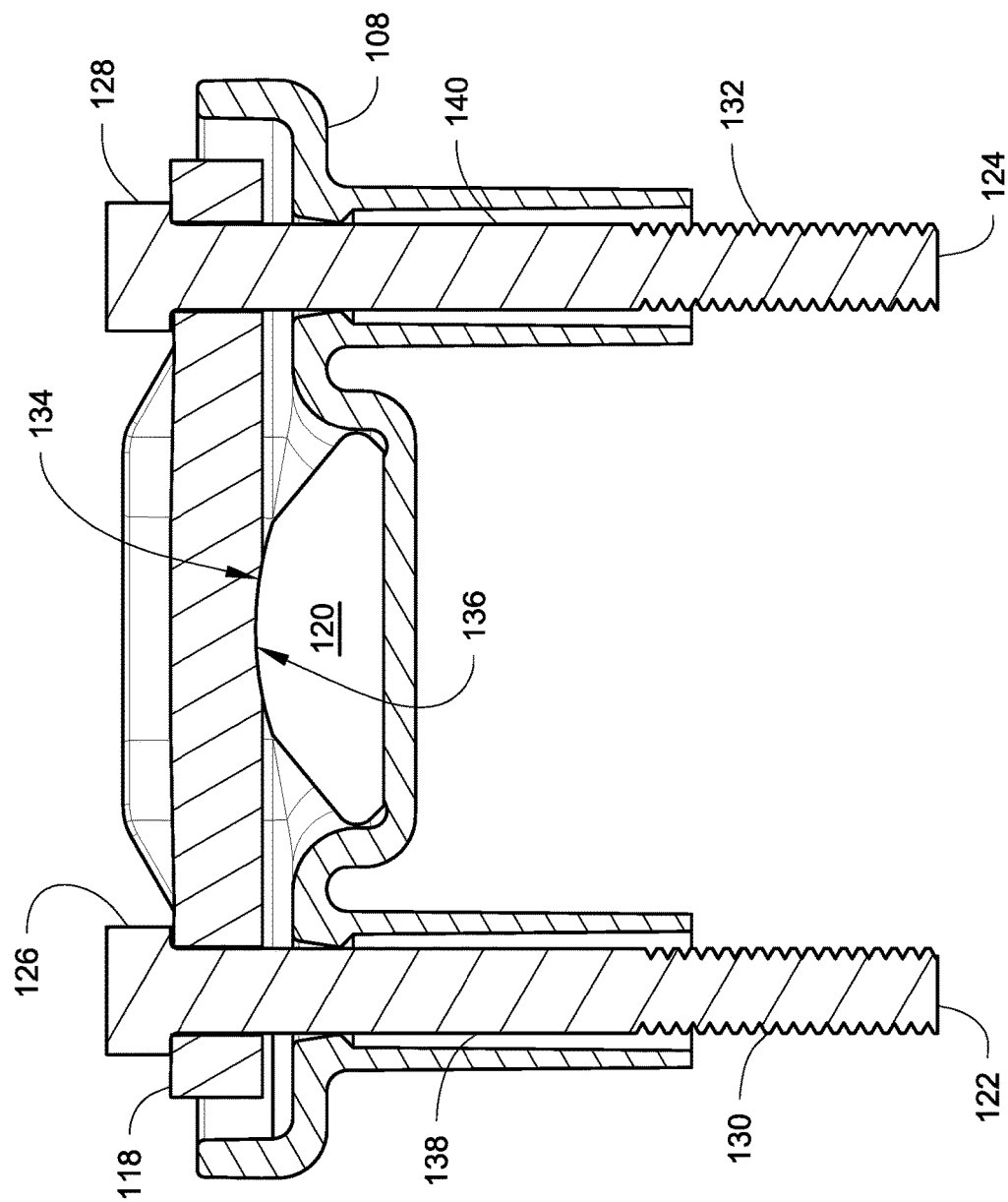
FIG. 3 shows a selected portion of the cutaway sectional view of the embodiment for the clamping system shown in FIGS. 1 and 2.

FIG. 3 shows a close view of a portion of the clamping device 100 shown in FIG. 2 (the insulator 108, the load beam 118, the pivot block 120, and bolts 122, 124). FIG. 3 shows the two bolts 122, 124 penetrating through the load beam 118 via respective holes in the body of the load beam 118. Each of the bolts 122, 124 have head portions 126, 128 that engage the load beam 118 near the respective holes in the load beam 118. Each of the bolts 122, 124 have respective threaded portions 130, 132 configured for engaging and connecting to matched threaded holes in the heat sink 114. The pivot block 120 has a curved (e.g., convex) top surface 134 for making contact with a contact portion 136 at the bottom surface of the load beam 118. The contact portion 136 can have a concave geometry to receive the curved top surface 134 of the pivot block 120. The contact portion 136 and the curved top surface 134 allow the load beam 118 to flex with a particular spring constant as required and/or as predetermined. The insulator 108 is configured to contain the pivot block 120 in a space defined by the upper surface of the insulator 108 and the lower surface of the load beam 118. Further, the insulator 108 has a shape for wrapping around and containing most of the rod-like portions 138, 140 of the bolts 122, 124. The insulator 108 also covers a substantial lower portion of the load beam 118.

Figure 4:
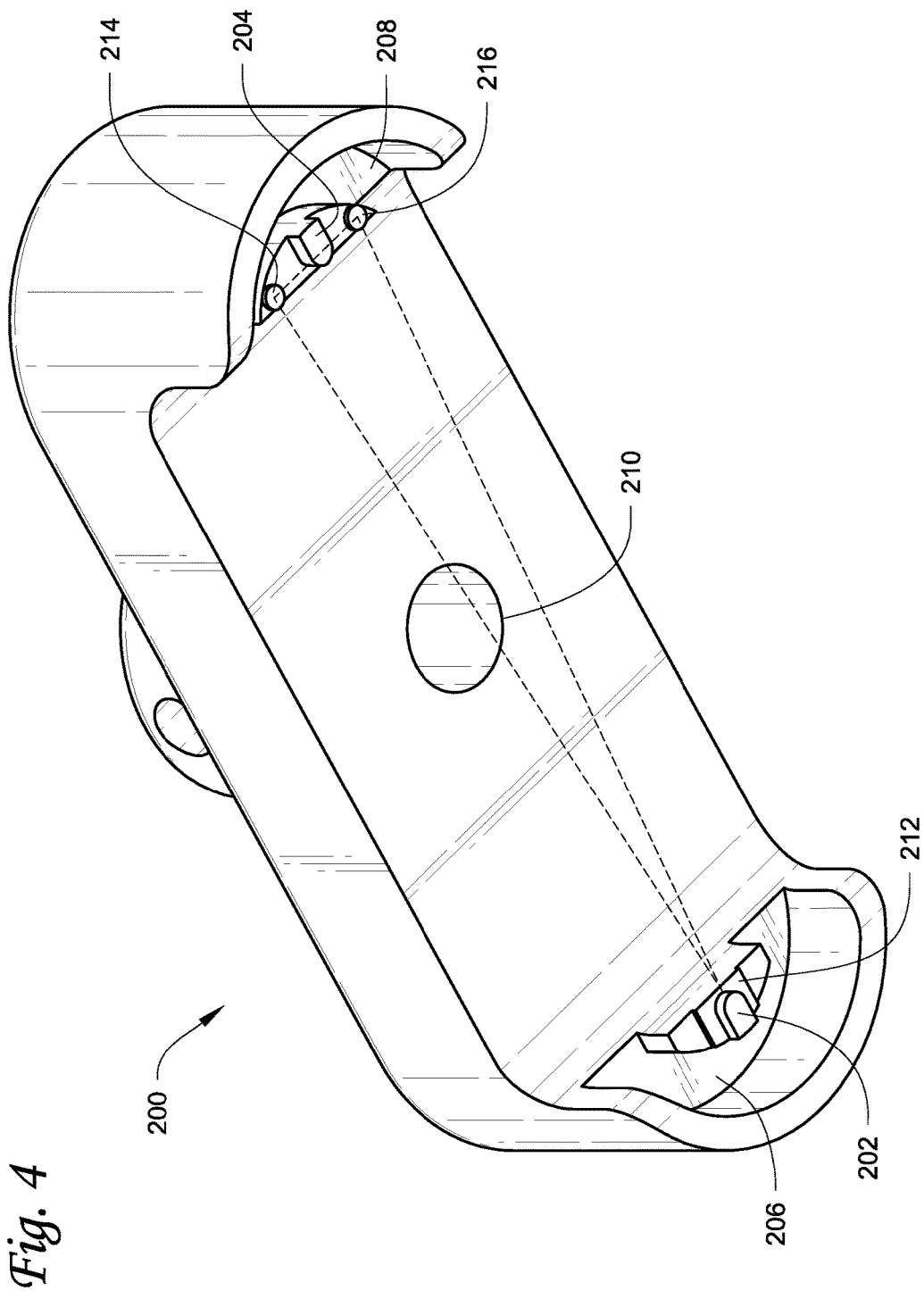
FIG. 4 shows an exemplary calibration gage for the clamping system shown in FIGS. 1 and 2.

FIG. 4 shows an isometric upward view of a bottom portion of an exemplary calibration gage 200 (similar to the calibration gage 104 shown in FIG. 2) and FIG. 5 shows an isometric downward view of a top portion of an exemplary load beam 300 (similar to the load beam 118 shown in FIG. 2). The exemplary calibration gage 200 is configured for connecting to the exemplary load beam 300. The calibration gage 200 and the load beam 300 can be a part of the clamping system (100 shown in FIGS. 1 and 2).

As shown in FIG. 4, the calibration gage 200 includes contact portions 202, 204 that are configured to connect to contact portions (302, 304 shown in FIG. 5) of the load beam (300 shown in FIG. 5).

Further, the calibration gage 200 also includes portions 206, 208 that are configured to connect to the insulator (108 shown in FIG. 2). The portions 206, 208 can each be, for example, an arced female connector that is configured to respectfully match and connect to male connectors of the insulator (108 shown in FIG. 2). Thus, the insulator can have contact portions which are arced male connectors configured to respectfully match and connect to the contact portions 206, 208 of the calibration gage 104.

The calibration gage 200 has a hole 210 penetrating from the upper surface to the bottom surface at the center of the body. The hole 210 allows the sensor tip (116 shown in FIG. 2) of the detector (102 shown in FIG. 2) to penetrate through the body of the calibration gage 200 from above the upper surface of the calibration gage 200, so the sensor tip can contact the load beam (300 shown in FIG. 5) positioned below the bottom surface of the calibration gage 200 in the clamping system (100 shown in FIG. 2).

The calibration gage 200 has contact portions 212, 214, 216 for contacting portions of the load beam (300 shown in FIG. 5). The contact portions 212, 214, 216 are arranged to form vertices of a virtual triangle (shown with dashed lines in FIG. 4), and the virtual triangle defines a virtual plane (i.e., a two-dimensional imaginary surface) from which a perpendicular (i.e., a normal direction to the plane) distance can be detected (e.g., with the sensor tip). The distance of the sensor tip being above or below the virtual plane defined by the contact portions 212, 214, 216 can be the amount of change in the depth of curvature of the load beam. The distance of the sensor tip from the virtual plane can be changed by the change in the load beam because the sensor tip 120 contacts a contact portion (306 shown in FIG. 5) of the top surface of the load beam.

As shown in FIG. 5, the load beam 300 includes contact portions 302, 304 that are configured to connect to contact portions (202, 204 shown in FIG. 4) of the calibration gage (200 shown in FIG. 4). The load beam 300 has a contact portion 306 on the top surface for contacting the sensor tip. The load beam 300 has contact portions 308, 310 on the top surface of the load beam 300, wherein the contact portion 308 is configured for contacting the contact portion 212, and the contact portion 310 is configured for contacting the contact portions 214, 216. The load beam 300 has five top surface portions 312, 314, 316, 318, 320 shaped to accommodate a deflection (i.e., bending) of the load beam 300, which can happen during use, operation, deterioration, fatigue, etc. The center region 312 of the top surface has a planar (i.e., flat) configuration. Along the length direction of the load beam 300, downward sloped regions 314, 316 of the top surface extend away from the center region 312 towards respective end regions 318, 320. The end regions 314, 316 slope upward extending away from the respective downward sloped regions 314, 316 towards the opposing end portions 322, 324 of the load beam 300. Accordingly, each of the downward sloped regions 314, 316 and the respective end regions 314, 316 is V-shaped. This shape is configured to have a "give" for the flexing (or deflection) of the load beam 300 against fittings for the bolts that penetrate through respective holes 326, 328 of the load beam 300. Accordingly, the entirety of the top surface portions 312, 314, 316, 318, 320 from the side has a "v-v" shape.

FIGS. 6A and 6B show schematic side view of the load beam 300 configured with bolts 330, 332 that penetrate through their respective holes 326, 328. FIG. 6A shows a first configuration of the load beam 300, wherein the load beam 300 does not have a bend. Thus, the "v-v" shape of the top surface portions 312, 314, 316, 318, 320 from one end 322 to the opposing end 324 of the load beam 300 is shown in this schematic side view. The end regions 314, 316 are sloped towards the center of the load beam 300, so that a gap 334, 336 is created between the lower surface of the head portion of each of the bolts 330, 332 and the respective end regions 314, 316.

FIG. 6B shows an exaggerated schematic view of a second configuration of the load beam 300, wherein the load beam 300 has a bend (arcing upward). Because of the bending, the load beam 300 in the second configuration does not have the "v-v" shape from the side. The end regions 314, 316 become planar due to the bend of the load beam 300 (from the rising slopes in the first configuration shown in FIG. 6A). Further, in the second configuration, the center region 312 rises higher than in the first configuration shown in FIG. 6A. The planarity of the end regions 314, 316 meet with the lower surface of the head portions of the bolts 330, 332.

Figure 7:
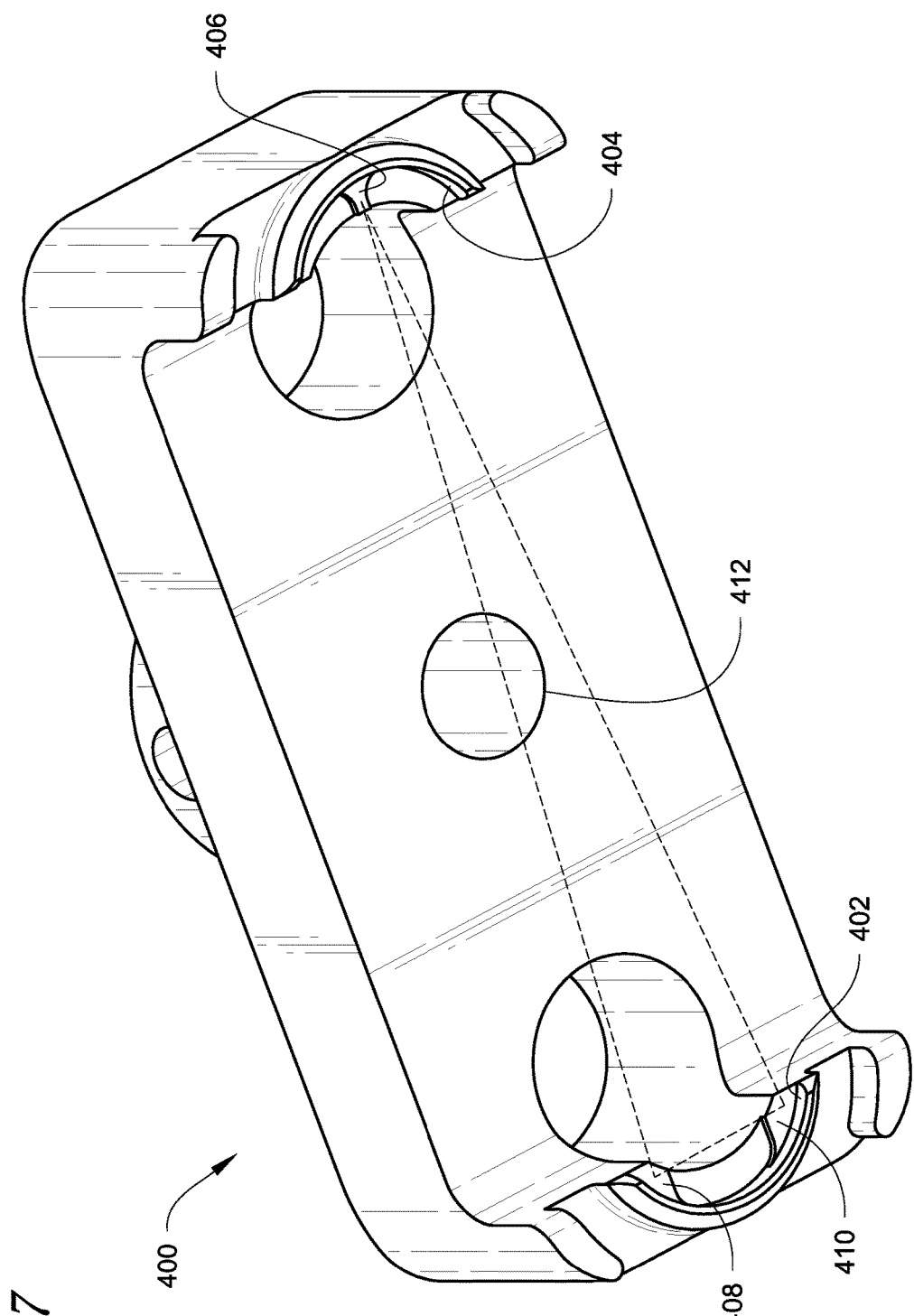
FIG. 7 shows another exemplary calibration gage for the clamping system shown in FIGS. 1 and 2.

FIG. 7 shows an isometric upward view of a bottom portion of another exemplary calibration gage 400 (similar to the calibration gage 104 shown in FIG. 2) and FIG. 8 shows an isometric downward view of a top portion of another exemplary load beam 500 (similar to the load beam 118 shown in FIG. 2). The exemplary calibration gage 400 is configured for connecting to the exemplary load beam 500. The calibration gage 400 and the load beam 500 can be a part of the clamping system (100 shown in FIGS. 1 and 2).

As shown in FIG. 7, the calibration gage 400 has engagement portions 402, 404 that are arced to mate and/or connect securely and respectively with opposing end portions (502, 504 shown in FIG. 8) of the load beam (500 shown in FIG. 8). Thus, the calibration gage 400 does not have the contact portions (202, 204 shown in FIG. 4) for connecting to the load beam like those in the exemplary calibration gage 200 shown in FIG. 4. Likewise, the load beam (500 shown in FIG. 8) does not have the contact portions (302, 304 shown in FIG. 5). The calibration gage 400 does have contact portions 406, 408, 410 for contacting the load beam (500). The contact portions 406, 408, 410 are arranged to form vertices of a virtual triangle (shown with dashed lines in FIG. 7), and the virtual triangle defines a virtual plane (i.e., a two-dimensional imaginary surface) from which a perpendicular (i.e., a normal direction to the plane) distance can be detected (e.g., with the sensor tip). The calibration gage 400 has a hole 412 penetrating from the upper surface to the bottom surface at the center of the body. The hole 412 allows the sensor tip (116 shown in FIG. 2) of the detector (102 shown in FIG. 2) to penetrate through the body of the calibration gage 400 from above the upper surface of the calibration gage 400, so the sensor tip can contact the load beam (500 shown in FIG. 8) positioned below the bottom surface of the calibration gage 400 in the clamping system (100 shown in FIG. 2).

As shown in FIG. 8, the load beam 500 has the opposing end portions 502, 504 that have arced portions configured to mate and securely connect with the engagement portions (402, 404 shown in FIG. 7) of the calibration gage (400 shown in FIG. 7).

The load beam 500 has a contact portion 506 on the top surface for contacting the sensor tip. The load beam 500 has contact portions 508, 510 on the top surface of the load beam 500, wherein the contact portion 508 is configured for contacting the contact portions 408, 410 (shown in FIG. 7), and the contact portion 510 is configured for contacting the contact portion 406 (shown in FIG. 7). The load beam 500 has five top surface portions 512, 514, 516, 518, 520 shaped to accommodate a deflection (i.e., bending) of the load beam 500, which can happen during use, operation, deterioration, fatigue, etc. The center region 512 of the top surface has a planar (i.e., flat) configuration. Along the length direction of the load beam 500, downward sloped regions 514, 516 of the top surface extend away from the center region 512 towards respective end regions 518, 520. The end regions 514, 516 slope upward extending away from the respective downward sloped regions 514, 516 towards the opposing end portions 522, 524 of the load beam 500. Accordingly, each of the downward sloped regions 514, 516 and the respective end regions 514, 516 is V-shaped. This shape is configured to have a "give" for the flexing (or deflection) of the load beam 500 against fittings for the bolts that penetrate through respective holes 522, 524 of the load beam 500. Accordingly, the entirety of the top surface portions 512, 514, 516, 518, 520 from the side has a "v-v" shape. Accordingly, the load beam 500 has the first configuration and the second configuration similar to those shown in FIGS. 6A and 6B and described above.

FIG. 9A shows an isometric downward view of a top portion of another exemplary load beam 600 (similar to the load beam 118 shown in FIG. 2). FIG. 9B shows a side cutaway view of the load beam 600. FIG. 9C shows a close view of a portion at one end of the load beam 600 shown in FIG. 9B. The load beam 600 can connect to the calibration gage 400 shown in FIG. 7, and can be a part of the clamping system (100 shown in FIGS. 1 and 2). As shown in FIG. 9A, the load beam 600 has opposing end portions 602, 604 that have arced portions configured to mate and securely connect with the engagement portions (402, 404 shown in FIG. 7) of the calibration gage (400 shown in FIG. 7). Unlike the load beam 500 shown in FIG. 8, the load beam 600 does not have five top surface portions (e.g., 512, 514, 516, 518, 520 shown in FIG. 8) which from the side has a "v-v" shape. Instead, as shown in FIGS. 9A-9C, the load beam 600 has a major top surface region 606 which is generally or completely planar. The load beam 600 has holes 608, 610 for receiving the bolts that penetrate therethrough. Each of the holes 608, 610 has, respectively, substantially circular sloped portions 612, 614 configured around (i.e., concentrically) the respective holes 608, 610. The circular sloped portions 612, 614 are configured with slopes to adapt with the deflection and/or bending of the load beam 600. The circular sloped portion 612 shown in FIG. 9C has a lowering slope towards the middle portion of the load beam 600 such that there would be a gap 616 between the surface of the circular sloped portion 612 and a head of a bolt (not shown). When the load beam 600 bends so that the middle portion of the load beam 600 rises, the circular sloped portion 612 can rise to make the gap smaller, and can meet the lower surface of the head of the bolt. It will be appreciated that the circular sloped portion 614 has a similar configuration as the circular sloped portion 612.

Figure 10:
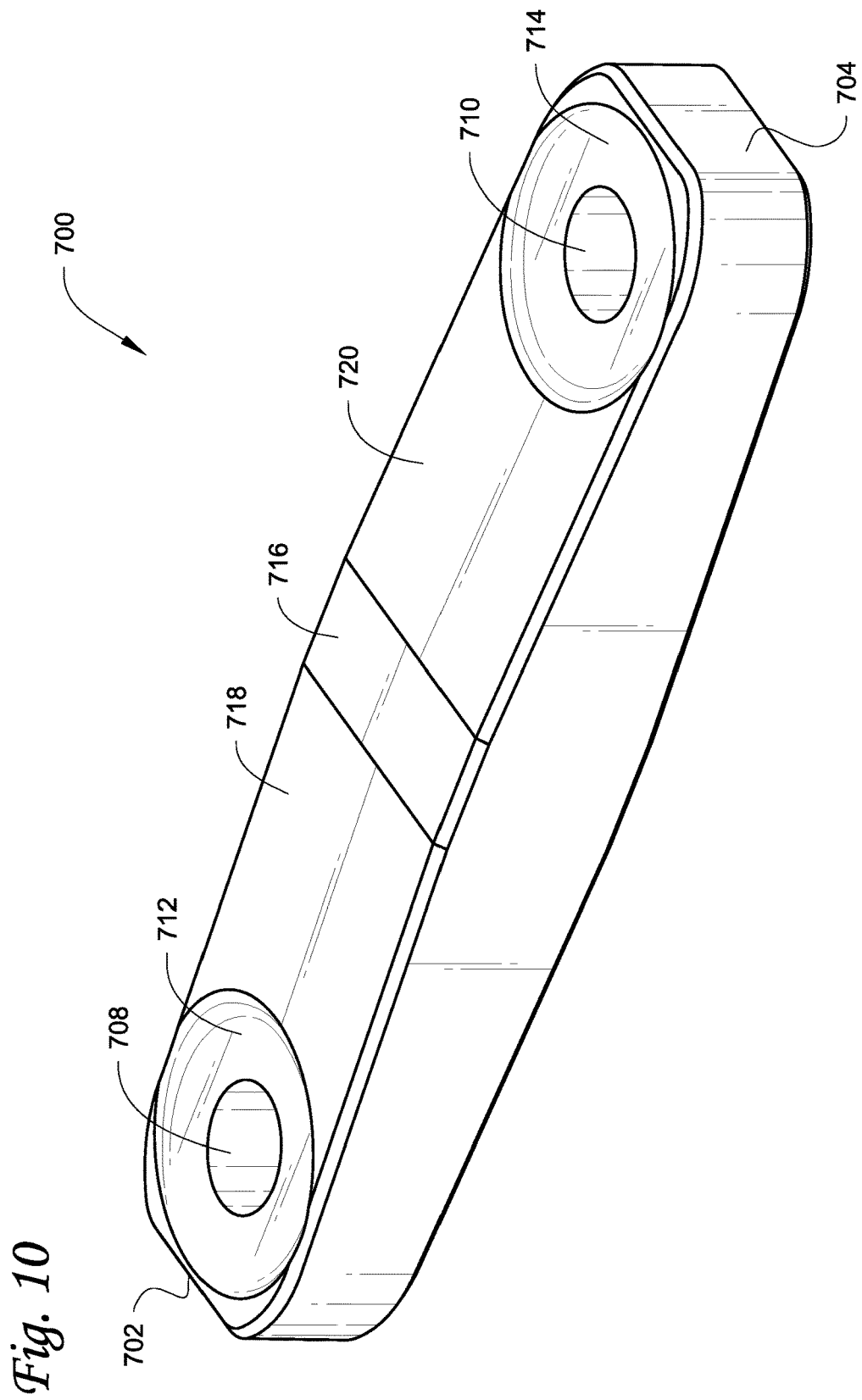
FIG. 10 shows another exemplary load beam for the clamping system shown in FIGS. 1 and 2.

FIG. 10 shows an isometric downward view of a top portion of another exemplary load beam 700 (similar to the load beam 600 shown in FIG. 9A). The load beam 700 can connect to the calibration gage 400 shown in FIG. 7, and can be a part of the clamping system (100 shown in FIGS. 1 and 2). As shown in FIG. 10, the load beam 700 has opposing end portions 702, 704 that have arced portions configured to mate and securely connect with the engagement portions (402, 404 shown in FIG. 7) of the calibration gage (400 shown in FIG. 7). The load beam 700 has holes 708, 710 for receiving the bolts that penetrate therethrough. Each of the holes 708, 710 has, respectively, substantially circular sloped portions 712, 714 configured around (i.e., concentrically) the respective holes 708, 710. The circular sloped portions 712, 714 are configured with slopes to adapt with the deflection and/or bending of the load beam 700 in substantially the same manner as the circular sloped portions 612, 614 shown in FIGS. 9A-9C. Accordingly, when the load beam 700 bends so that the middle portion of the load beam 700 rises, the circular sloped portions 712, 714 rise to make the respective gaps smaller. Unlike the load beam 500 shown in FIG. 8, the load beam 700 does not have five top surface portions (e.g., 512, 514, 516, 518, 520 shown in FIG. 8) which from the side has a "v-v" shape. Also, unlike the load beam 600 shown in FIGS. 9A-9C, the load beam 700 does not have a major top surface region that is mostly or completely planar. Instead, the load beam 700 has top surface portions 716, 718, 720, wherein the middle top surface portion 716 is planar, and the two side top surface portions 718, 720 extend in a sloping manner from the middle top surface portion 716 towards respective end portions 702, 704.

Figure 11:
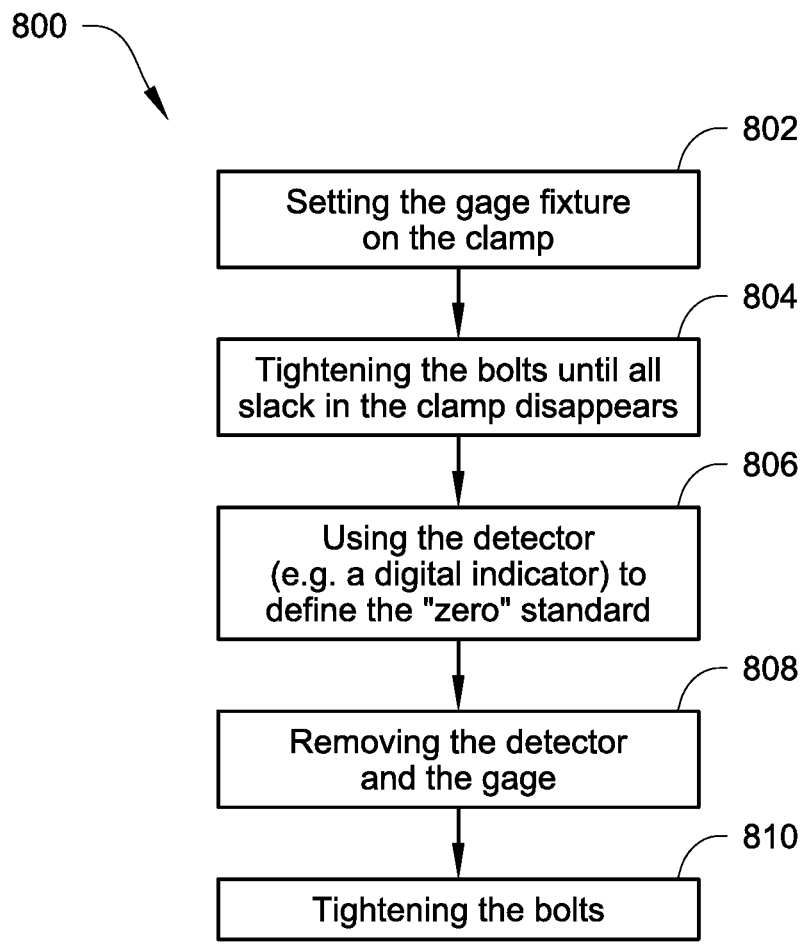
FIG. 11 shows a flowchart for an embodiment of a method for clamping one or more press-pack semiconductor(s).

FIG. 11 shows a flowchart for an embodiment of a method 800 for clamping one or more press-pack semiconductor(s). The clamp setting method includes setting 802 the calibration gage fixture on the clamp, then tightening 804 the bolts until all slack in the clamp disappears. In some embodiments, bolt torque of 5 inch-ounces or less can achieve this. Use the detector (e.g., a digital indicator) and define 806 the "zero" standard. Then, removing 808 the detector and the calibration gage, and tightening 810 the bolts in small increments alternating between bolts.

Periodically, an operator can set the calibration gage back on the clamp and check the deflection of the load beam. If needed, the bolts can be backed off to reduce the deflection until the appropriate deflection is achieved. This way, appropriate clamp preload has been achieved.

Accordingly, the systems and methods described herein can be used to monitor long term deflection and loads in the load beam. For example, press pack clamped systems experience relaxation of clamp loads over time due to slow deformation of various loaded parts in the clamp system. The system described above can be used to determine if deflection of the load beam has decreased over time with an associated loss in clamp load. This can be important because sufficient loss of clamp load can lead to semiconductor device and system failure.

Figure 12:
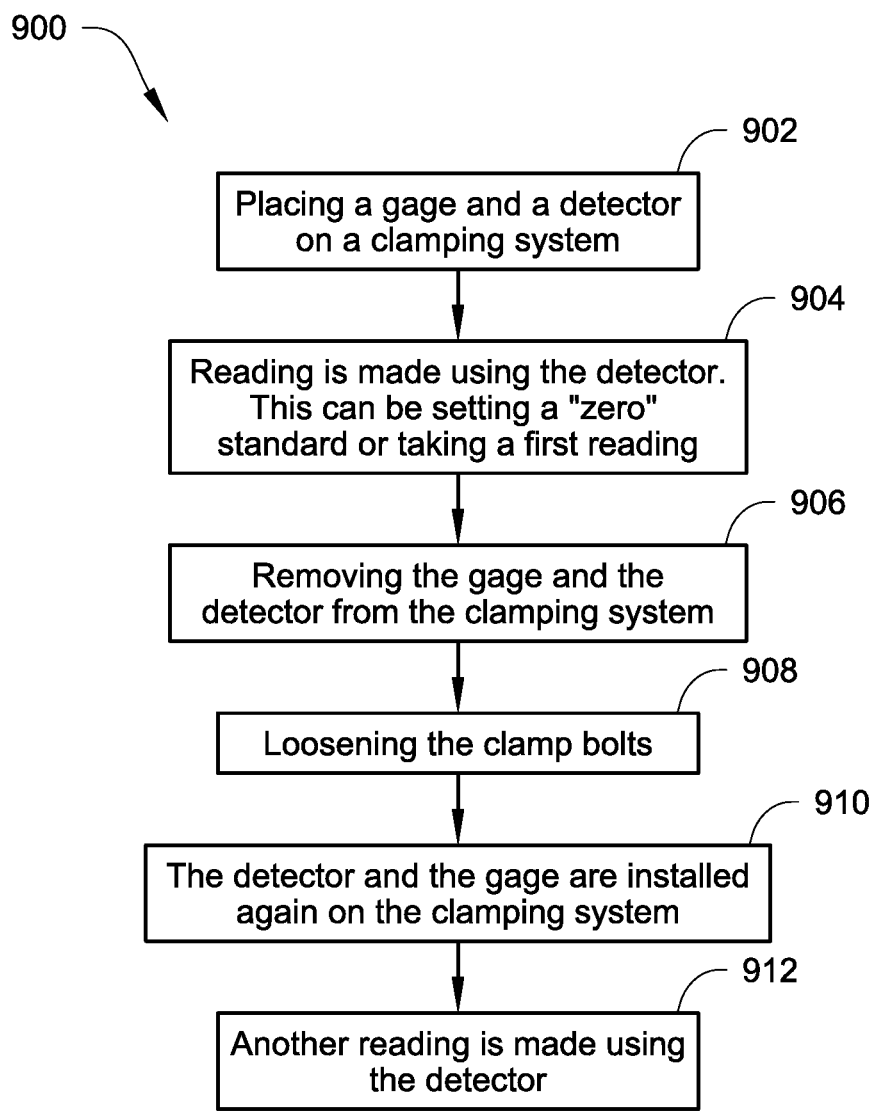
FIG. 12 shows a flowchart for an embodiment of a method for monitoring long term deflection and load on the load beam during and/or after extended time in service.

FIG. 12 shows a flowchart for an embodiment of a method 900 for monitoring long term deflection and load on the load beam during and/or after extended time in service. The process for checking the retained deflection on the clamp after extended time in service includes, placing 902 a calibration gage and a detector on a clamping system, while the detector is turned on. The calibration gage and the detector can be assembled together prior to being placed on the clamping system. Alternatively, the calibration gage can be placed on the clamping system and then the detector can be assembled to the calibration gage.

Then, the method 900 includes a step of setting 904 a "zero" standard on the detector (e.g., and storing the "zero" standard in a non-transitory computer readable memory, or rotating an analog or digital dial of a needle indicator to set a "zero" standard from which a difference can be measured via the needle indicator, etc.). Alternatively, the setting the "zero" standard on the detector can be performed prior to the detector and the calibration gate are placed 902 on the clamping system. In which case, after the step of placing 902 the calibration gage and the detector on the clamping system, step 904 is performing a reading (detecting) using the detector to take a first reading (detecting) of the depth of curvature (instead of setting the "zero" standard).

Then, the detector and the calibration gage are removed 906 from the clamping system. Then, the clamp bolts are loosened 908 until there is some slack in the load beam. Then, the detector and the calibration gage are installed again 910 on the clamping system, and another reading (detecting) 912 is made using the detector.

The reading can show that the load beam is deflected. If the absolute value of a difference between the readings is less than the original (predetermined) clamp deflection target, then the clamping system has undergone some level of physical creep over time and some clamp preload has been lost. Targets for clamp preload are predetermined (e.g., available from the press pack device manufacturer). This information in conjunction with the deflection data from the gauge and detector allow determination whether the clamping system is maintaining the intended clamp load over time. If not, the clamping system can either be reset to an appropriate deflection or replaced if there is evidence of unacceptable loss of preload. The procedure can be used on a failed press pack device to determine if loss of clamp preload may be a contributing factor in device failure.

The size of the clamping system can vary depending on industrial applicability. As the size of the clamping system is made to be smaller, clearances (i.e., spaces) between a calibration gage and a load beam of the clamping system also becomes smaller. The clearances can be in the region of a fraction of an inch. When the clearances are very small, there can be a tendency for the calibration gage to make contact with one or more of the fixture block, the load beam, and the insulator. Contact between these bodies can lead to, for example, a situation where the fixture block is hung up on the insulator and not maintain intimate contact with the load beam. This can lead to measurement errors.

Figure 13:
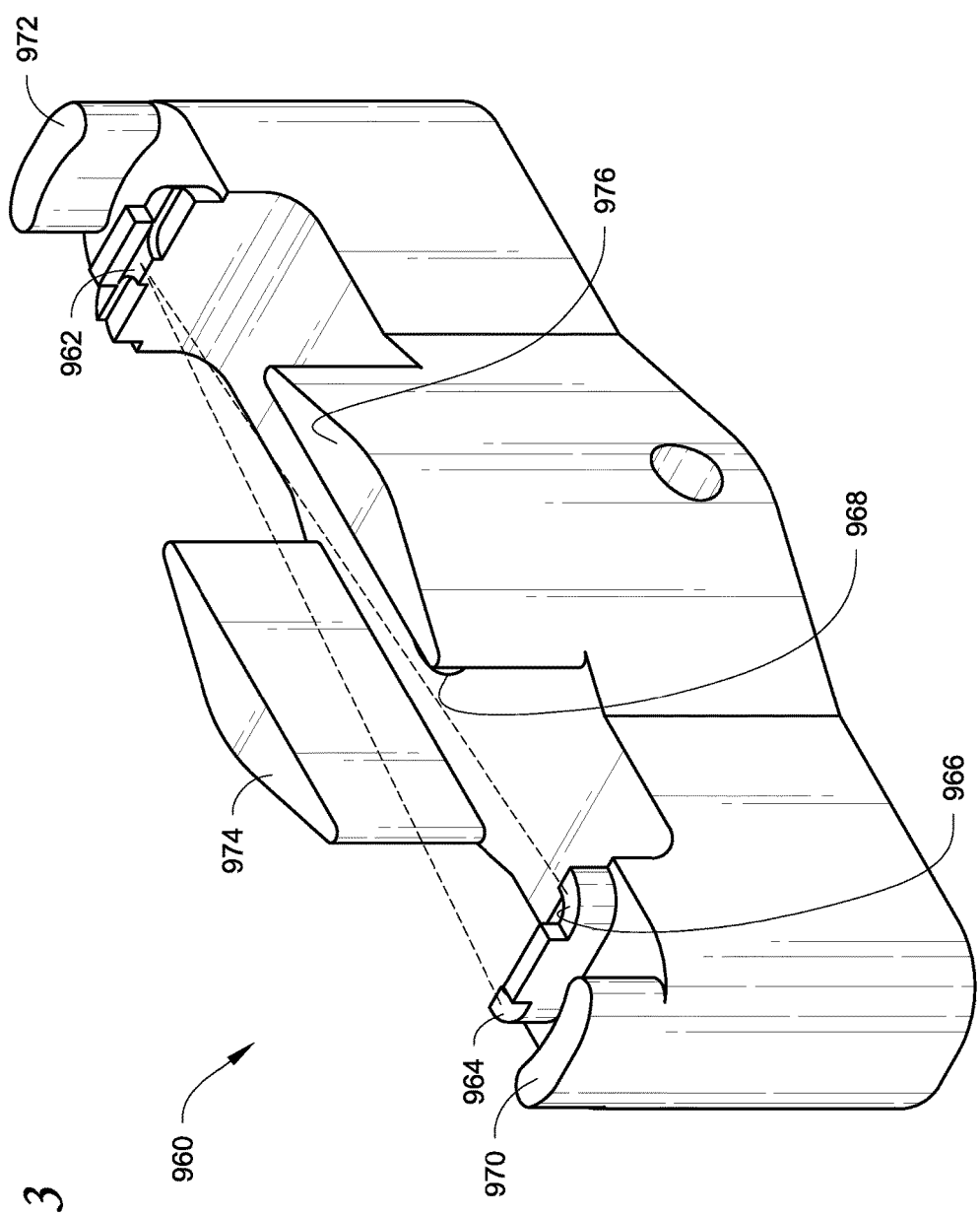
FIG. 13 shows another embodiment of a calibration gage for the clamping system.

FIG. 13 shows an isometric upward view of a bottom portion of another exemplary calibration gage 960 (e.g., similar to the calibration gage 104 shown in FIG. 2). The exemplary calibration gage 960 is configured for connecting to a load beam (e.g., similar to the load beam 118 shown in FIGS. 2 and 3). The calibration gage 960 and the load beam can be a part of a clamping system (e.g., similar to the system 100 shown in FIGS. 1 and 2). As shown in FIG. 13, the calibration gage 960 has contact portions 962, 964, 966 that are configured to connect securely and respectively with end portions of a load beam (e.g., similar to the load beam 300 shown in FIG. 5). The contact portions 962, 964, 966 are arranged to form vertices of a virtual triangle (shown with dashed lines), and the virtual triangle defines a virtual plane (i.e., a two-dimensional imaginary surface) from which a perpendicular (i.e., a normal direction to the plane) distance can be detected (e.g., with the sensor tip). The calibration gage 960 has a hole 968 penetrating from the upper surface to the bottom surface at the center of the body. The hole 968 allows the sensor tip (e.g., 116 shown in FIG. 2) of the detector (e.g., 102 shown in FIG. 2) to penetrate through the body of the calibration gage 960 from above the upper surface of the calibration gage 960, so the sensor tip can contact the load beam (e.g., 300 shown in FIG. 5) positioned below the bottom surface of the calibration gage 960 in the clamping system. The calibration gage 960 includes a plurality protective portions 970, 972, 974, 976 for protecting the contact portions 962, 964, 966 from damage if the calibration gage 960 were to be dropped. The protective portions 970, 972 are at opposing ends along the major length direction of the calibration gage 960. The protective portions 974, 976 are at opposing sides along the width direction (i.e., minor length direction) of the calibration gage 960, about the middle region along length-wise. The heights of the protective portions 970, 972, 974, 976 along the thickness direction of the calibration gage 960 are greater than the heights along the thickness direction of the contact portions 962, 964, 966, thus, the protective portions 970, 972, 974, 976 have ends at the heights that protrude beyond the highest points of the contact portions 962, 964, 966 along the thickness direction of the calibration gage 960.

Preferred embodiments have been described. Those skilled in the art will appreciate that various modifications and substitutions are possible, without departing from the scope of the invention as claimed and disclosed, including the full scope of equivalents thereof.

What is claimed is:

1. A clamping system for a press pack high power semiconductor, comprising:
    a heat sink;
    a load beam;
    a pair of bolts securely connecting the load beam to the heat sink,
    wherein the load beam includes a planar surface, a pair of holes receiving the bolts, and a pair of sloped portions, and
    one of the sloped portions surrounds one of the holes, and the other one of the sloped portions surrounds the other one of the holes;
    a pivot block disposed between the load beam and the heat sink, the pivot block being in contact with the load beam, the pivot block being configured for allowing deflection of the load beam along a predetermined direction;
    an insulator surrounding portions of the bolts, the insulator having a cavity defined by a body of the insulator, wherein the pivot block is entirely disposed within the cavity, and at least a part of the load beam is disposed within the cavity;
    the load beam having a first configuration wherein the each of the sloped portions is not respectively in contact with the bolts, and a second configuration wherein the sloped portions are respectively in contact with the bolts; and
    a monitoring system configured to detect a depth of curvature of the load beam without disassembling the pair of bolts securely connecting the load beam to the heat sink, the monitoring system includes a calibration gage that does not make any contact with the insulator, the calibration gage including one or more regions that define a virtual plane from which a position of a monitoring sensor tip is measured from.

2. The clamping system as in claim 1, wherein the insulator comprises highly glass filled polyetheretherketone (PEEK).

3. The clamping system as in claim 1, wherein the insulator comprises liquid crystal polymer (LCP).

4. The clamping system as in claim 1, wherein the insulator comprises thermoplastic polyester.

5. The clamping system as in claim 1, wherein the insulator comprises polyimide.

6. The clamping system as in claim 1, wherein the press pack high power semiconductor is sandwiched between the insulator and the heat sink.

7. The clamping system as in claim 1, further comprising an electrical bus bar disposed between the insulator and the press pack high power semiconductor.

8. The clamping system as in claim 1, wherein the monitoring system comprises:
    a detector having a sensor tip for contacting and detecting a depth of curvature of a surface, and
    wherein the calibration gage is configured to connect to the insulator with mated connecting regions, and the calibration gage includes a hole for allowing the sensor tip to penetrate through from one side to an opposing side of the calibration gage.

* * * * *